(12) United States Patent
Ivanov et al.

(10) Patent No.: US 6,545,538 B1
(45) Date of Patent: Apr. 8, 2003

(54) RAIL-TO-RAIL CLASS AB OUTPUT STAGE FOR OPERATIONAL AMPLIFIER WITH WIDE SUPPLY RANGE

(75) Inventors: Vadim V. Ivanov, Tucson, AZ (US); Gregory H. Johnson, Tuscon, AZ (US); Stephen J. Sanchez, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/677,967

(22) Filed: Oct. 3, 2000

(51) Int. Cl.[7] ................................................. H03F 3/45
(52) U.S. Cl. .......................... 330/255; 330/253; 330/261
(58) Field of Search ................................. 330/253, 255, 330/261

(56) References Cited

U.S. PATENT DOCUMENTS

| | | | |
|---|---|---|---|
| 4,015,212 A | * 3/1977 | Miyata | |
| 4,419,631 A | * 12/1983 | Bertails et al. | |
| 4,570,128 A | 2/1986 | Monticelli | 330/267 |
| 4,573,021 A | * 2/1986 | Widlar | |
| 4,959,623 A | 9/1990 | Khoury | 330/265 |
| 5,039,953 A | 8/1991 | Su | 330/264 |
| 5,258,723 A | 11/1993 | Mazzucco et al. | 330/258 |
| 5,293,136 A | 3/1994 | Ryat | 330/258 |
| 5,294,892 A | 3/1994 | Ryat | 330/253 |
| 5,294,893 A | 3/1994 | Ryat | 330/258 |
| 5,311,145 A | 5/1994 | Huijsing et al. | 330/255 |
| 5,412,309 A | 5/1995 | Ueunten | 330/316 |
| 5,491,448 A | 2/1996 | Naokawa et al. | 330/264 |
| 5,515,006 A | * 5/1996 | Chan | |
| 5,734,287 A | 3/1998 | Consiglio et al. | 330/317 |
| 5,739,721 A | 4/1998 | Brehmer | 330/253 |
| 5,825,244 A | 10/1998 | Somayajula | 330/253 |
| 5,825,246 A | 10/1998 | Koifman et al. | 330/255 |
| 5,854,573 A | 12/1998 | Chan | 330/292 |
| 5,900,783 A | 5/1999 | Dasgupta | 330/264 |
| 5,933,055 A | 8/1999 | Dosho | 330/255 |
| 5,939,944 A | 8/1999 | Gibson | 330/255 |
| 5,942,940 A | * 8/1999 | Dreps et al. | |
| 6,064,267 A | * 5/2000 | Lewyn | 330/288 |
| 6,342,816 B1 | * 1/2002 | Gradzki | 330/311 |

OTHER PUBLICATIONS

"Some Design Aspects of a Two–Stage Rail–to–Rail CMOS Op Amp" by Gierkink et al., Analog Integrated Circuits and Signal Processing, vol. 21, No. 2, Nov. 1999, pp. 143–152. Note: This article is essentially the same as the one mentioned in the Background of the Invention on p. 2, lines 9–11.

"Tristate Programmable Driver Circuit", IBM Technical Disclosure Bulletin, Jul. 1977, pp. 766–768.

* cited by examiner

*Primary Examiner*—Patricia T. Nguyen
(74) *Attorney, Agent, or Firm*—W. Daniel Swayze, Jr.; W. James Brady; Frederick J. Telecky, Jr.

(57) ABSTRACT

A rail-to-rail class AB output stage includes a P-channel pull-up transistor (4) having a source coupled to a first supply rail voltage ($V^+$), a gate coupled to a first input conductor (2) of the output stage, and a drain coupled to an output terminal (6) of the output stage. An N-channel pull-down transistor (5) includes a source coupled to a second supply rail voltage (GROUND), a gate coupled to a second input conductor (3) of the output stage, and a drain coupled to the output terminal (6). A P-channel first bias transistor (20) includes a source coupled to the first input conductor (2) and a drain coupled to the second input terminal (3). A first bias circuit coupled between the first and second supply rail voltages produces a first bias voltage (21) on a gate of the first bias transistor (20). A P-channel second bias transistor (10) includes a source coupled to be first input conductor (2). An N-channel third bias transistor (11) includes a source coupled to the second input terminal (3) and a drain connected to a drain of the second bias transistor (10) and to a non-inverting input of a servo amplifier (12) having an output coupled to a gate of the second bias transistor (10) and an inverting input coupled to a gate of the third bias transistor (11) or a suitable reference voltage. A second bias circuit coupled between the first and second supply rail voltages produces a second bias voltage (16) on the gate of the third bias transistor (11) and the inverting input of the servo amplifier.

18 Claims, 4 Drawing Sheets

RAIL-TO-RAIL CLASS AB OUTPUT STAGE FOR OPERATIONAL AMPLIFIER WITH WIDE SUPPLY RANGE

BACKGROUND OF THE INVENTION

The invention relates generally to the field of integrated circuit CMOS operational amplifiers, and more particularly to rail-to-rail class AB output stages for integrated circuit CMOS operational amplifiers, and still more particularly to such operational amplifiers and class AB output stages thereof which (1) are made using a low cost "single well" CMOS manufacturing process wherein large drain-body leakage currents are caused by drain-source voltages of more than approximately 1–2 volts, and (2) are operable both at high and low power supply voltages without nonlinear distortion caused by large leakage currents due to impact ionization.

By way of background, in many applications it is very desirable that an integrated circuit operational amplifier be capable of "rail-to-rail" operation. This means that the output voltage of the operational amplifier, which typically is produced by a class AB output stage, should be able to swing close to the upper power supply voltage and the lower power supply voltage. (The upper power supply voltage can be called V+ and the lower power supply voltage can be called "ground".) The closest prior art presently known to the inventors includes U.S Pat. No. 5,311,145 (Huijsing et al.), U.S Pat. No. 4,570,128 (Monticelli), and the article "Design Aspects of Rail-to-Rail CMOS OpAm" by Gierkink, Holzmann, Wiegerink, and Wassenaar, Proceedings of the First VLSI Workshop, May 6–8, 1997, Columbus, Ohio, pp. 23–28.

If rail-to-rail operational amplifiers of the prior art are manufactured using "single well" CMOS processes rather than the more complex and more expensive "double well" processes, then there are large leakage currents due to impact ionization in the MOSFETs when they are subjected to drain-to-source voltages greater than approximately 1–2 volts. The drain-body leakage of an MOS transistor is proportional to the current in the source electrode thereof, and is a highly nonlinear function of the drain-source voltage of the MOS transistor. From a circuit analysis viewpoint, the drain-body leakage current can be thought of as a parasitic nonlinear resistor connected between the drain and body electrodes of a MOSFET. In a class AB output stage, that nonlinear parasitic resistance can become the dominating factor in the equivalent input resistance of the class AB output stage. For a typical "single well" manufacturing process, the drain-body leakage of an MOS transistor is almost negligible when its drain-source voltage is less than 1–2 volts, but the drain-body leakage current rapidly increases for larger drain-source voltages. Therefore, both P-channel and N-channel MOSFETs in a CMOS circuit are likely to have drain-to-body leakage currents that are large enough to impair circuit operation (for example, by reducing the open loop gain of an operational amplifier and by causing nonlinear distortion of an operational amplifier output) if the supply voltage $V_{DD}$ is greater than about 3 volts. The drain-source voltage at which the drain-body leakage current becomes significant decreases substantially as the channel length decreases from for example 6.0 microns to 5.5 microns or less. Although this problem could be solved if the transistors of the class AB output stage are placed in separate wells in a "double-well" manufacturing process (with their body electrodes connected to their source electrodes) typical "double-well" manufacturing processes are usually more than twice as expensive as typical "single-well" manufacturing processes. Since the leakage currents in similar CMOS operational amplifiers manufactured using "single-well" manufacturing processes cause the gains of the operational amplifiers to be reduced as the supply voltage increases, it has not been practical to provide an inexpensive, highly linear, high-speed, rail-to-rail CMOS integrated circuit operational amplifier.

Those skilled in the art know that providing more than two gain stages in an operational amplifier decreases the speed of the operational amplifier. Each additional gain stage beyond two decreases the speed of the operational amplifier by a factor of 2–4. Therefore, there is a difficult trade-off between the objectives of increasing the operating speed of an operational amplifier and increasing its open loop gain by adding gain stages.

Accordingly, there is an unmet need for a high speed integrated circuit CMOS operational amplifier, and a class AB output stage therefor having rail-to-rail operation, wherein the operational amplifier and the class AB output stage are manufactured using low cost single-well CMOS technology, and are operable at high speed without substantial signal instability or signal distortion even at high power supply voltages that normally would cause drain-source voltages large enough to result in substantial drain-body leakage currents in MOSFETs of the class AB output stage.

SUMMARY OF THE INVENTION

Accordingly, it is an object of the invention to provide a class AB rail-to-rail output stage which is stable and linear over a wide range of supply voltages.

It is another object of the invention to provide a class AB rail-to-rail output stage which is stable and linear over a wide range of supply voltages and is manufactured by a low cost single-well CMOS manufacturing process.

It is another object of the invention to provide an inexpensive, stable high speed rail-to-rail operational amplifier having a class AB rail-to-rail output stage, wherein the operational amplifier is linear over a wide range of supply voltages.

It is another object of the invention to provide an inexpensive, stable rail-to-rail operational amplifier having a class AB rail-to-rail output stage, wherein the operational amplifier is linear over a wide range of supply voltages and is manufactured by a low cost single-well CMOS manufacturing process.

It is another object of the invention to provide an inexpensive, high speed, stable rail-to-rail operational amplifier having a class AB rail-to-rail output stage and which avoids. deterioration of amplifier gain as the supply voltage increases.

It is another object of the invention to provide an inexpensive two-stage, high speed operational amplifier having high gain.

It is another object of the invention to provide a very compact, high-performance operational amplifier in a small package.

It is another object of the invention to provide a rail-to-rail class AB output stage having very high equivalent input resistance.

Briefly described, and in accordance with one embodiment thereof, the invention provides a technique for reducing impact ionization in an N-channel MOSFET (11) in a CMOS integrated circuit device so as to reduce a drain-tobody leakage current in the MOSFET, including forming the MOSFET in a P-type substrate in a single-well CMOS manufacturing process, coupling a non-inverting input and an inverting input of a servo amplifier (12) to a drain of the MOSFET and a reference voltage (65), respectively. The servo amplifier is operated to control a drain current in the MOSFET so as to prevent the magnitude of the drain-source voltage of the MOSFET from exceeding a value at which impact ionization causes the drain-to-body leakage current to exceed a predetermined level.

In one embodiment, the invention provides a rail-to-rail class AB output stage including: a P-channel pull-up transistor (4) having a source coupled to a first supply rail voltage ($V^+$), a gate coupled to a first input conductor (2) of the output stage, and a drain coupled to an output terminal (6) of the output stage. An N-channel pull-down transistor (5) has a source coupled to a second supply rail voltage (GROUND), a gate coupled to a second input conductor (3) of the output stage, and a drain coupled to the output terminal (6). A P-channel first bias transistor (10) includes a source coupled to the first input conductor (2), and an N-channel second bias transistor (11) has a source coupled to the second input terminal (3) and a drain connected to a drain of the first bias transistor (10). A servo amplifier (12) includes an output (15) coupled to a gate of the first bias transistor (10), a non-inverting input coupled to the drain of the second bias transistor (11), and an inverting input coupled to a reference or bias voltage (65). A bias circuit is coupled between the first and second supply rail voltages and produces a bias voltage (16) on the gate of the second bias transistor (11).

In another embodiment, the invention provides a CMOS rail-to-rail operational amplifier including a rail-to-rail differential input stage (35) receiving a differential input signal ($V_{IN}$), a folded cascode stage (34) receiving the first (38) and second (39) output signals from the differential input stage (35), and a rail-to-rail class AB output stage (1). The output stage includes a P-channel pull-up transistor (4) having a source coupled to a first supply rail voltage ($V^+$), a gate coupled to a first input conductor (2) of the output stage, and a drain coupled to an output terminal (6) of the output stage. The first input conductor (2) conducts a first current ($I_{IN}^+$) produced by the folded cascode stage (34). An N-channel pull-down transistor (5) includes a source coupled to a second supply rail voltage (GROUND), a gate coupled to a second input conductor (3) of the output stage, and a drain coupled to the terminal (6). The second input conductor (3) conducts a second current ($I_{IN}^-$) produced by the folded cascode stage (34). A P-channel first bias transistor (10) includes a source coupled to the first input conductor (2). An N-channel second bias transistor (11) includes a source coupled to the second input terminal (3) and a drain connected to a drain of the first bias transistor (10). A servo amplifier (12) includes an output (15) coupled to a gate of the first bias transistor (10), a non-inverting input coupled to the drain of the second bias transistor (11), and an inverting input coupled to a reference or bias voltage (65). A bias circuit is coupled between the first and second supply rail voltages and produces a bias voltage (16) on the gate of the second bias transistor (11).

DETAILED DESCRIPTION OF THE PREFERRED EMBODIMENTS

Figure 1:
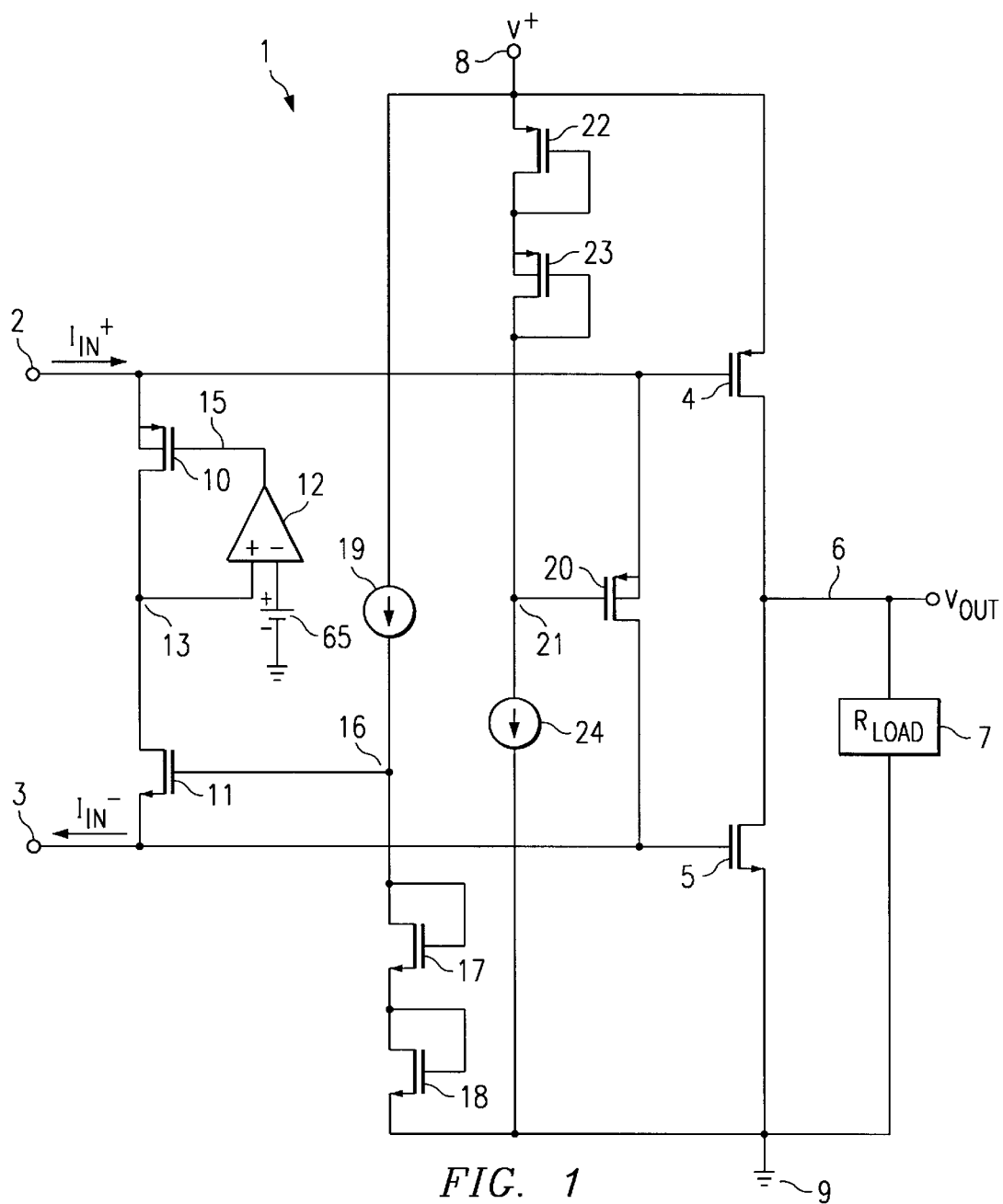
FIG. 1 is a schematic diagram of a rail-to-rail class AB output stage suitable for use in an operational amplifier.
Figure 3:
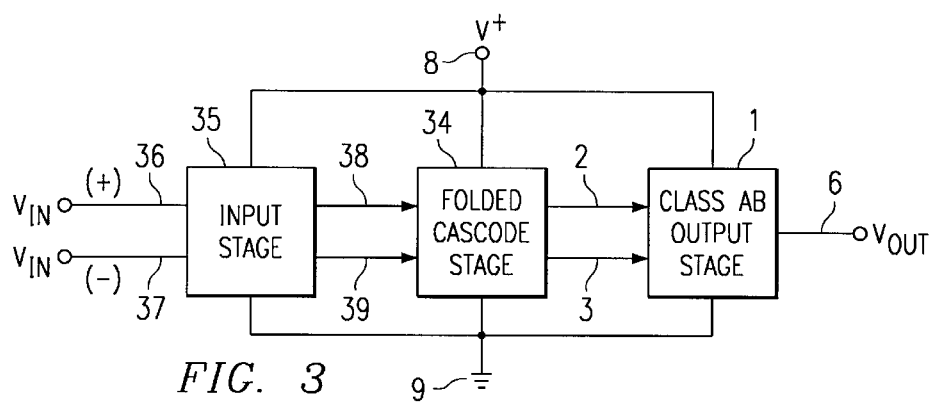
FIG. 3 is a block diagram of a rail-to-rail operational amplifier including the class AB output stage of FIG. 1 or FIG. 2.

FIG. 1 is a schematic diagram of a basic implementation of the rail-to-rail class AB output stage according to the present invention. Its input conductors 2 and 3 receive differential input current signals $I_{IN}^+$ and $I_{IN}^-$ from the gain stage (not shown) of an operational amplifier. The gain stage typically is a folded cascode stage (FIG. 3) which receives its input signals from the electrodes of the input MOSFETs of a differential input stage (FIG. 3).

The differential input stage of a rail-to-rail operational amplifier can be similar or identical to the input stage shown in FIG. 1 of U.S. Pat. No. 5,311,145 by Huijsing et al., entitled "COMBINATION DRIVER-SUMMING CIRCUIT FOR RAIL-TO-RAIL DIFFERENTIAL AMPLIFIER", incorporated herein by reference. The input stage typically includes an upper folded cascode circuit and a lower folded cascode circuit, both of which function as current sources. (The input stage in FIG. 1 of the foregoing Huijsing et al. reference includes a current source labeled 10 therein and transistors labeled $Q_{I1,2 \ldots 7}$ therein.) The upper folded cascode circuit supplies the current $I_{IN}^+$, and the lower folded cascode circuit sinks the current $I_{IN}^-$. Input conductors 2 and 3 are connected to the gate electrodes of a P-channel pull-up output MOSFET 4 and an N-channel pull-down MOSFET 5, respectively, with their sources connected as shown to $V^+$ conductor 8 and ground conductor 9, respectively. The drains of pull-up MOSFET 4 and pull-down MOSFET 5 are connected to conductor 6 to apply the output voltage $V_{OUT}$ across load resistance 7.

A P-channel bias MOSFET 20 has its source either directly connected to input conductor 2 as shown in FIG. 1 or indirectly coupled to input conductor 2 by means of an intermediate differential stage as shown in subsequently described FIG. 1. The drain of MOSFET 20 is connected to input conductor 3. The body electrodes of MOSFETs 10, 20 and 23 also are connected to their sources. Note that if the body electrode of a MOSFET is connected to its source, then all of any drain current diverted as drain-body leakage current nevertheless flows through the source electrode. The above mentioned non-linear parasitic resistance is no longer problematic. (The other MOSFETs in FIG. 1 do not have their body electrodes connected to their source electrodes.) The gate of bias MOSFET 20 is connected by conductor 21 to the junction between a constant current source 24 and a pair of series-coupled diode-connected P-channel MOSFETs 22 and 23, which are coupled between junction 21 and $V^+$ as shown. MOSFET 23 has its body electrode connected to its source electrode.

Figure 6:
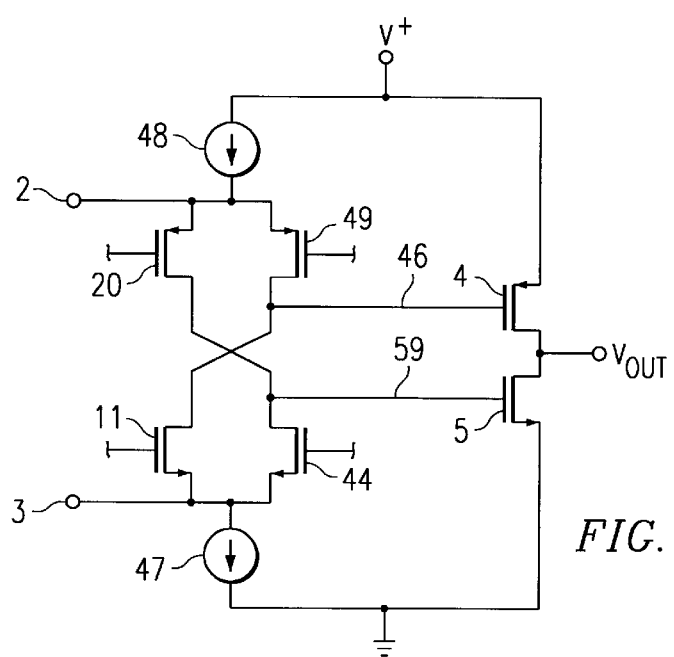
FIG. 6 is a partial schematic diagram of an intermediate differential stage which can be used in the circuit of FIG. 1.

An N-channel MOSFET 11 has its source either directly connected to input conductor 3 as shown in FIG. 1 or indirectly coupled to input conductor 3 by means of an intermediate differential stage as shown and subsequently described FIG. 6. The drain of MOSFET 11 is connected by conductor 13 to the drain of a P-channel MOSFET 10 and to the (+) input of an amplifier 12. The source of MOSFET 10 is connected to input conductor 2. The gate of MOSFET 11 is biased by the voltage on conductor 16, which is connected to the junction between a current source 19 and a pair of series-coupled diode-connected N-channel MOSFETs 17 and 18 which are coupled between junction 16 and ground. The (−) input of an amplifier 12 is connected to the (+) terminal of a reference voltage circuit 65 that is referenced to ground. The output of servo amplifier 12 is connected by conductor 15 to the gate of MOSFET 10.

A problem of the circuit shown in FIG. 1 of the above mentioned Huijsing et al. U.S. Pat. No. 5,311,145 arises if the circuit is manufactured using a so-called "single well" CMOS manufacturing process and if V$^+$ is greater than approximately 3 volts. The problem arises because the circuit is manufactured using the single well CMOS manufacturing process, and if the drain voltage of N-channel MOSFET 11 is more than approximately 1–2 volts above its source voltage, then a large, very nonlinear drain-to-body leakage current occurs due to impact ionization in the depletion region of MOSFET 11. The large nonlinear leakage current causes nonlinear amplification that reduces the gain of the operational amplifier and unacceptably distorts $V_{OUT}$. One way of solving that problem is to use a conventional "double well" CMOS manufacturing process. Unfortunately, double well CMOS processes generally are more than twice as expensive as conventional single well CMOS processes. For completeness, FIG. 4 shows the cross-sectional structure of an N-channel MOSFET and a P-channel MOSFET in a conventional single well CMOS process, and FIG. 5 shows the cross-sectional structure of an N-channel MOSFET and a P-Channel MOSFET in a conventional double-well process.

As Indicated above, the source of MOSFET 11 can be indirectly coupled to input conductor 3. Also, the source of MOSFET 20 can be indirectly coupled to input conductor 2. FIG. 6 shows a portion of another Class AB output stage in which this is accomplished. The input conductors 2 and 3 are connected to the common source nodes of a pair of cross-coupled differential stages, respectively. One of the differential stage is includes above mentioned P-channel transistor 20 and a P-channel transistor 49 having their respective sources connected by input conductor 2 to a constant current source 48 which also is connected to V+ as shown. The other differential stage includes above mentioned N-channel transistor 11 and an N-channel transistor 44 having their respective sources connected by input conductor 3 to a constant current source 47 which also is connected to ground as shown. The drain of transistor 11 is connected by conductor 46 to the drain of transistor 49 and to the gate of output transistor 4. The drain of transistor 20 is connected by conductor 59 to the gate of output transistor 5. The above described circuitry for preventing impact ionization in transistor 11 can be adapted to control the drain current of transistor 11 to achieve that result. The circuit is described thoroughly in commonly owned co-pending patent application "FAST RAIL-TO-RAIL CLASS AB OUTPUT STAGE HAVING STABLE OUTPUT BIAS CURRENT AND LINEAR PERFORMANCE", by Vadim Ivanov, Ser. No. 09/527,695, filed on Mar. 16, 2000, Docket No. 0437-A-228, incorporated herein by reference.

Figure 4:
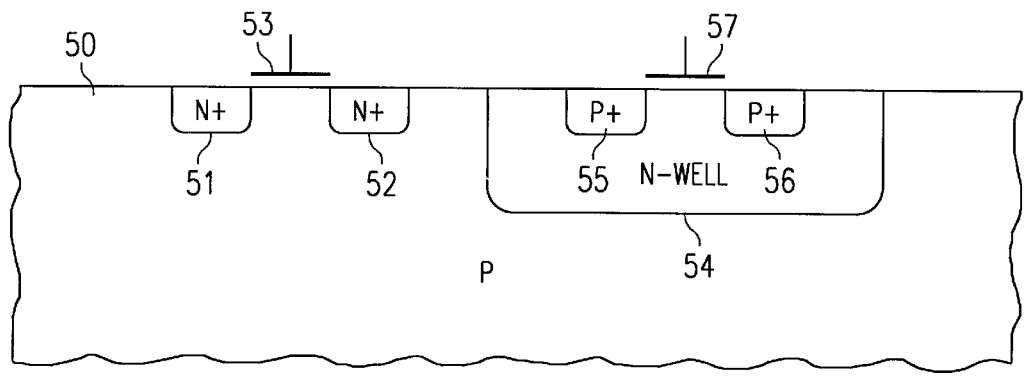
FIG. 4 is a section in view diagram of a conventional "single-well" CMOS device structure.
Figure 5:
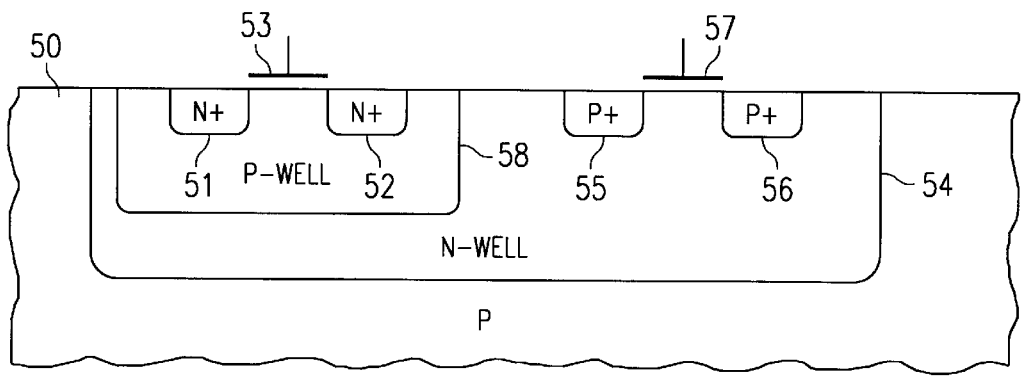
FIG. 5 is a section in view diagram of a conventional "double-well" CMOS device structure.

Referring to FIG. 4, the illustrated single-well CMOS device includes an N-channel MOSFET including an N+ source region 51 and an N+ drain region 52 in a P-type substrate 50. A lightly doped N-type well region 54 is located in the upper surface of substrate 50. A P-channel MOSFET formed in N-type well 54 includes P-type source and drain regions 55 and 56, respectively, located in the upper surface of N-type well 54. Numerals 53 and 57 designate the gate electrodes of the N-channel and P-channel MOSFETs, respectively. Similarly, in FIG. 5 the conventional double well structure includes an N-type well 54 formed in the upper surface of P-type substrate 50. A P-channel MOSFET including source and drain regions 55 and 56 is formed in the upper surface of N-type well 54. A P-type well 58 is located in the upper surface of N-type well 54. An N-channel MOSFET including N+ regions 51 and 52 is formed in the upper surface of P-type well 58.

The new features of the present invention include servo amplifier 12, P-channel MOSFET 10, and N-channel MOSFET 11 connected as shown in FIG. 1 to keep the voltage on drain conductor 13 of MOSFET 11 at the value set by the reference voltage 65. The reference voltage has a value which prevents the drain-to-source voltage of MOSFET 11 from ever becoming large enough to cause an unacceptably large drain-to-body leakage current to flow in MOSFET 11. Avoiding the large drain-to-body leakage current in MOSFET 11 results in also avoiding the loss of operational amplifier gain caused by the leakage current. Avoiding the loss of gain due to the drain-to-body leakage current allows the operational amplifier to have high gain without providing additional gain stages. In turn, this avoids the above mentioned trade-off between speed and gain in designing the operational amplifier.

Eliminating the large drain-to-body leakage current in MOSFET 11 also prevents the above mentioned nonlinearity of class AB output stage 1 from being caused by such leakage current.

Perhaps the understanding of this point can be helped by recognizing that the transimpedance (i.e., the current-to-voltage gain) of a class AB output stage is $1/g_{m2} = R_{equiv} \cdot g_{out} \cdot R_{LOAD}$, where $R_{equiv}$ is the equivalent resistance at the inputs of the class AB output stage, $g_{out}$ is the average transconductance of output MOSFETs 4 and 5, and $R_{LOAD}$ is the load resistance. The value of $R_{LOAD}$ cannot be controlled by the circuit designer, and the transconductance of output transistors 4 and 5 is determined by their size and the quiescent current through them. The only parameter which can be manipulated is $R_{equiv}$, which represents the combined effects of the parallel gate impedance of output transistors 4 and 5, the output impedance of the previous stage (which can be made very high), and the drain-body leakage currents of the transistors of the class AB output stage. The arrangement shown in FIG. 1 eliminates the drain-body leakage current of N-channel MOSFET 11 and prevents it from reducing $R_{equiv}$.

Figure 2A:
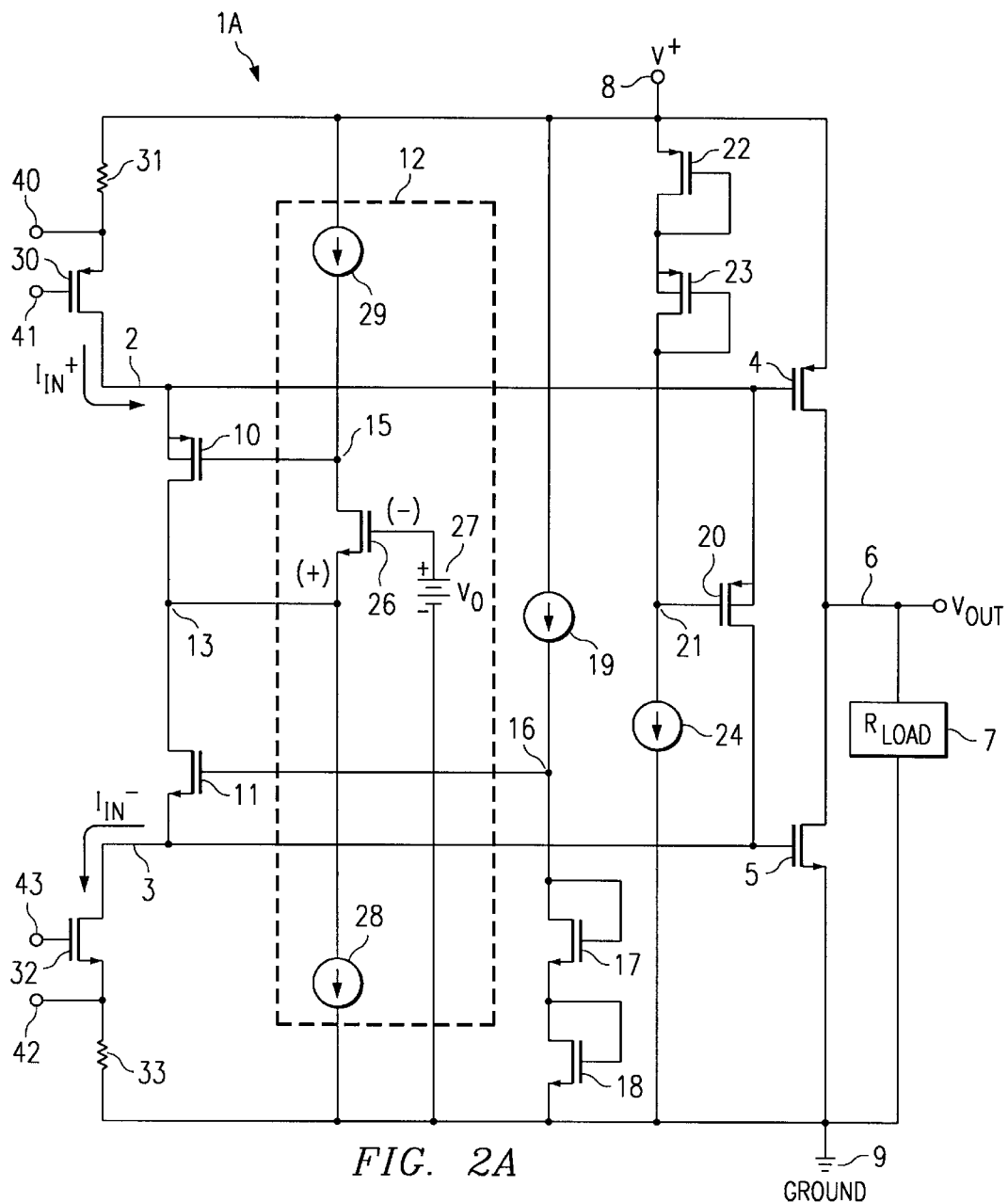
FIG. 2A is a more detailed schematic diagram of the rail-to-rail class AB output stage of FIG. 1.

FIG. 2A shows a simple, practical implementation of the circuit shown in FIG. 1. In the embodiment of FIG. 2, a portion of the above mentioned folded cascode circuit includes a P-channel cascode MOSFET 30 having its drain connected to input conductor 2 of class AB output stage 1A. The source of cascode MOSFET 30 is connected by conductor 40 to one terminal of a resistor 31, the other terminal of which is connected to V+ conductor 8, Conductor 40 receives a signal from the drain of an N-channel MOSFET of a differential input stage (not shown). The gate of cascode MOSFET 30 is connected to conductor 41, which receives a bias voltage from a suitable bias circuit. Similarly, an N-channel cascode MOSFET 32 has its drain electrode connected to input conductor 3 of class AB output amplifier 1A. The source electrode of cascode MOSFET 32 is connected by conductor 42 to one terminal of a resistor 33, the other terminal of which is connected to ground conductor 9.

The gate of cascode MOSFET 32 is connected to conductor 43. Conductor 42 is connected to receive a signal from the drain of the P-channel MOSFET of another differential input stage (not shown), and conductor 43 is connected to receive a suitable bias voltage.

The embodiment of FIG. 2A is similar to the embodiment of FIG. 1. In FIG. 2A amplifier 12 includes N-channel MOSFET 26 and constant current sources 28 and 29. The drain of MOSFET 26 is connected by conductor 15 to the gate of MOSFET 10 and to one terminal of constant current source 29, the other terminal of which is connected by conductor 8 to V$^+$. The source of MOSFET 26 is connected to conductor 13. The gate of MOSFET 26 constitutes the (−) input of servo amplifier 12, and is connected to the (+) terminal of a constant voltage source 27 having a value of V$_0$ and having its negative terminal connected to ground conductor 9. The source of MOSFET 26 constitutes the (+) input of servo amplifier 12, and is connected by conductor 13 to one terminal of constant current source 28, which has its other terminal connected to ground conductor 9. The source of MOSFET 26 constitutes the (+) input of amplifier 12, and is connected by conductor 13 to one terminal of constant current source 28, which has its other terminal connected to ground conductor 9. The output of servo amplifier 12 in FIG. 2A, is produced on conductor 15. The gate of MOSFET 26 (which serves as the (−) input of amplifier 12) is connected to a reference voltage V$_0$, which is produced by voltage source circuit 27 or alternatively by any other serves such as conductor 13, and is enough higher than the reference voltage on conductor 16 to ensure that MOSFET 26 is turned on and a suitable VDS voltage exists across MOSFET 11. This prevents the above described impact ionization from ever occurring, so the large nonlinear leakage current does not occur even if V$^+$ is varied over a wide range of voltages, so the undesirable nonlinearity of the class AB output stage is avoided. The associated loss of gain of the operational amplifier including the class AB output stage also is avoided.

Note that as the power supply voltage V+ increases, the drain-source voltage of n-channel MOSFET 26 will increase. When the drain-source voltage exceeds 1–2 volts (for a single well process), there will be drain-to-body leakage to the substrate, and an equal portion of the drain current will not flow through the source because the body of MOSFET 26 is not connected to its source. Constant current sources 28 and 29 of FIG. 2A have the same value, so if the source of MOSFET 26 does not supply part of the constant current required by current source 28, then current source 28 will demand the deficiency from node 13. The current demanded from node 13 by constant current source 28 then appears as a parasitic leakage current between input conductive to and 3, and has the appearance of a highly nonlinear parasitic resistance between conductor's 2 and 3. However, the magnitude of current sources 28 and 29 can be made much smaller than the magnitude of the input currents flowing in input conductors 2 and 3. In that case, the apparent parasitic current and nonlinear resistance between input conductors 2 and 3 then would be proportional to the very small magnitude of constant current source 29, and therefore would be negligible would be negligible.

Figure 2B:
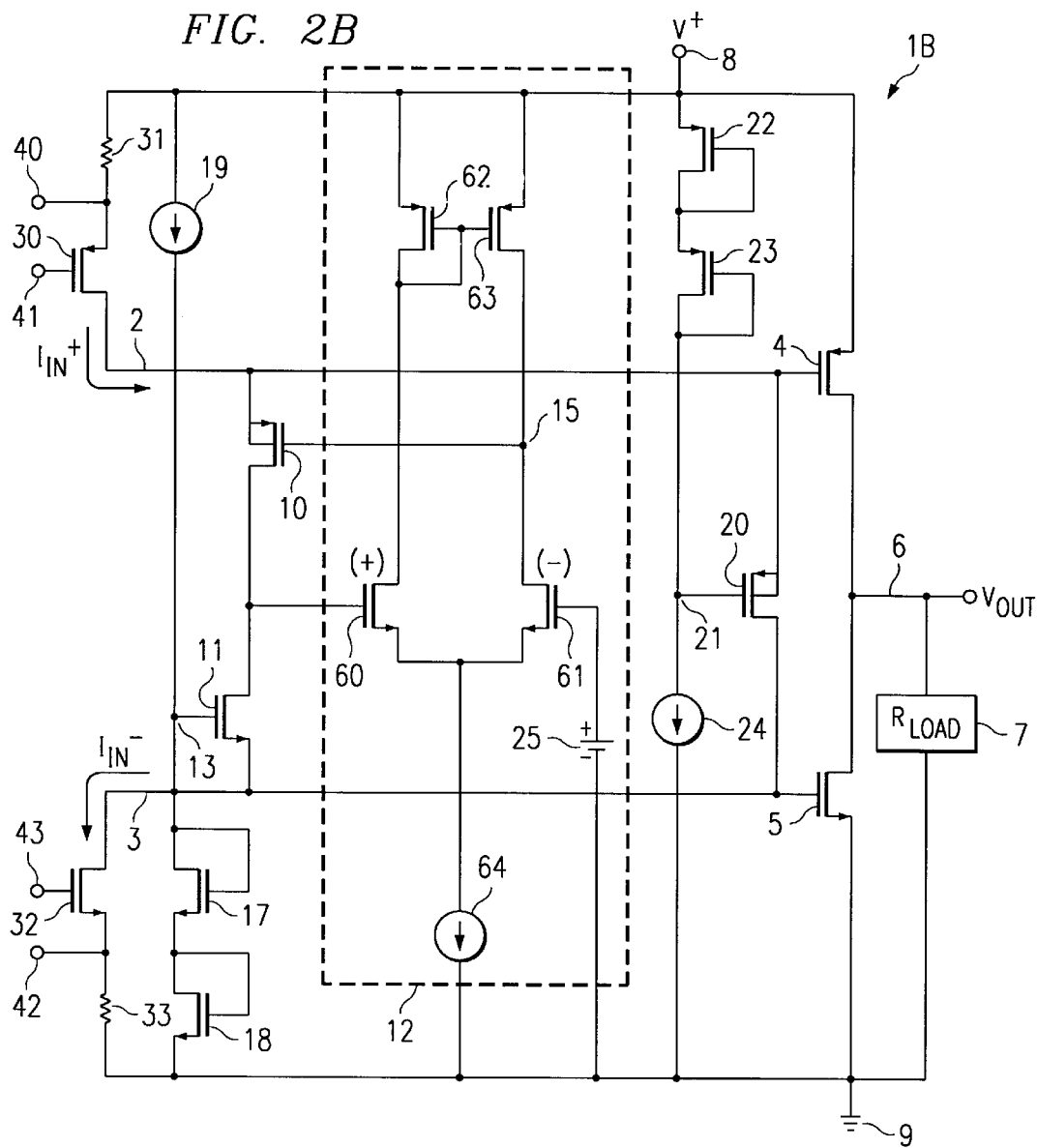
FIG. 2B is a detailed schematic diagram of another embodiment of the output stage of FIG. 1.

Another embodiment shown in FIG. 2B also is similar to the embodiment in FIG. 1. However, In FIG. 2B servo amplifier 12 includes a fully differential amplifier including N-channel input MOSFETs 60 and 61 having their source electrodes connected to one terminal of a constant current source 64, the other terminal of which is connected to ground. The gate of MOSFET 60 is connected to the drains of MOSFETs 10 and 11, and constitutes the (+) input of amplifier 12. The gate of MOSFET 61 constitutes the (−) input of amplifier 12, and is connected to the positive terminal of a voltage reference source 25. The voltage applied to the gate of MOSFET 61 can be any voltage such that the drain-to-source voltage of MOSFET 11 has a sufficiently low value to avoid impact ionization and the resulting drain-body leakage current. Therefore, the gate of MOSFET 61 can be connected to a suitable reference voltage indicated by 25, or alternatively, the gate of MOSFET 61 could be connected to, for example, conductor 13. P-channel MOSFETs 62 and 63 constitute a current mirror load circuit for input MOSFETs 60 and 61. The sources of current mirror MOSFETs 62 and 63 are connected to V$^+$ and their gates are connected to the drain of MOSFET 60. The drain of MOSFET 63 is connected by conductor 15 to the drain of input MOSFET 61 and to the gate of MOSFET 10. The value of V$_0$ is set so that the drain voltage of MOSFET 11 is never more than approximately 2 volts above its source voltage. This prevents the above described impact ionization from ever occurring. Consequently, the large nonlinear leakage current does not occur even if V$^+$ is varied over a wide range of voltages, and the undesirable nonlinearity of the class AB output stage is avoided.

The embodiment of FIG. 2A operates faster than the embodiment of FIG. 2B because there is less delay from the source to the drain of MOSFET 26 in FIG. 2A than there is from the drain of MOSFET 11 through MOSFETs 60 and 61 to conductor 15 in FIG. 2B. The implementation of servo amplifier 12 shown in FIG. 2B avoids the above described problem of drain-body leakage in MOSFET 26 of FIG. 2A. The circuit shown in FIG. 2A year is potentially somewhat less stable because of its higher speed.

FIG. 3 shows how class AB output stage 1 of FIG. 1 can have its input terminals 2 and 3 connected to the outputs of a folded cascode stage 34, which provides a high impedance interface between input stage 35 and class AB output stage 1. The differential inputs 38 and 39 of folded cascode stage 34 are connected to the outputs of a differential input stage 35 of which is similar or identical to the one shown in FIG. 1 of the above mentioned Hujising et al. reference, so as to provide a rail-to-rail operational amplifier 100 having its power supply terminals connected to the positive rail conductor 8 (V+) and the negative rail conductor 9 (ground), respectively, to produce a highly linear output voltage V$_{OUT}$ on conductor 6 in response to the differential input signal V$_{IN}$ applied between the (+) input terminal 36 of the input stage 35 and the (−) input terminal 37 of input stage 35.

The described operational amplifier eliminates deterioration of amplifier gain as the supply voltage increases, and needs only the disclosed input stage, folded cascode stage, and class AB output stage to provide an exceptionally high speed-power ratio and a high gain (of greater than 100 dB) with linear operation over a wide power supply voltage range.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the gain stage and that supplies the currents I$_{IN}^+$ and I$_{IN}^{31}$ do not have to include folded cascode circuitry.

For example, N-channel transistor 11 in FIG. 1 could be a transistor of other kinds of CMOS integrated circuits manufactured using single well processes. Then servo amplifier 12 could be utilized with its (−) input connected to the gate of N-channel transistor 11 as shown and its (+) connected to the drain of P-channel transistor 11 as shown. The gate of N-channel transistor 11 would be connected to a suitable reference voltage and the output of servo amplifier 12 would be connected to control a circuit to determine the amount of current flowing through the drain of the N-channel MOSFET 11 so as to maintain the voltage between the drain and source of MOSFET 11 at a sufficiently low voltage to prevent the occurrence of an unacceptably large drain-to-body leakage current in MOSFET 11. As another example, it would be possible to provide a class AB output stage similar to the ones disclosed herein, except that the output MOSFETs 4 and 5 could have their drains coupled to the supply rail conductors 8 and 9, respectively, and their sources connected to output conductor 6. As another example, the various voltage sources/reference voltage circuits illustrated here in can be implemented in a wide variety of ways other than by using the constant current sources and diode-connected MOS transistors as illustrated. Often, a conductor which is at the desired voltage can be conveniently used to bias the gate of an MOS transistor because its DC input impedance is nearly infinite.

What is claimed is:

1. A method of reducing impact ionization in a MOSFET in an integrated circuit device so as to reduce drain-to-body leakage current in the MOSFET, comprising the steps of:
   (a) forming the MOSFET in a region of the integrated circuit device;
   (b) coupling a first input of an amplifier to a drain of the MOSFET, and coupling a second input of the amplifier to a voltage source; and
   (c) operating the amplifier to control a drain current in the MOSFET so as to prevent the magnitude of the drain-source voltage of the MOSFET from exceeding a value at which impact ionization causes the drain-to-body leakage current to exceed a predetermined level.

2. A method of reducing impact ionization in an N-channel MOSFET in a CMOS integrated circuit device so as to reduce drain-to-body leakage current in the MOSFET, comprising the steps of:
   (a) forming the MOSFET in a P-type substrate in a single-well CMOS structure by using a single-well CMOS manufacturing process;
   (b) coupling a first input of an amplifier to a drain of the MOSFET, and coupling a second input of the amplifier to a voltage source; and
   (c) operating the amplifier to control a drain current in the MOSFET so as to prevent the magnitude of the drain-source voltage of the MOSFET from exceeding a value at which impact ionization causes the drain-to-body leakage current to exceed a predetermined level.

3. An impact ionization reduction circuit in a CMOS integrated circuit made by using a single-well CMOS manufacturing process, the impact ionization reduction circuit comprising:
   (a) an N-channel MOSFET formed in a P-type substrate of the CMOS integrated circuit;
   (b) a amplifier having a first input coupled to a drain of the N-channel MOSFET and a second input coupled to a voltage having a fixed relationship to a voltage of the source of the N-channel MOSFET; and
   (c) circuitry operative in conjunction with the amplifier to control the drain current of the N-channel MOSFET so as to prevent the magnitude of the drain-source voltage of the N-channel MOSFET from exceeding a value at which impact ionization causes the drain-to-body leakage current in the N-channel MOSFET to exceed a predetermined level.

4. A rail-to-rail class AB output stage including:
   (a) a P-channel pull-up transistor having a first terminal coupled to a first supply rail voltage, a gate coupled to a first input conductor of the output stage, and a second terminal coupled to an output terminal of the output stage;
   (b) an N-channel pull-down transistor having a first terminal coupled to a second supply rail voltage, a gate coupled to a second input conductor of the output stage, and a second terminal coupled to the output terminal;
   (c) a P-channel first bias transistor having a source coupled to the first input conductor;
   (d) an N-channel second bias transistor having a source coupled to the second input terminal and a drain connected to a drain of the first bias transistor;
   (e) a amplifier having an output coupled to a gate of the first bias transistor, a first input coupled to the drain of the second bias transistor, and a second input coupled to a first reference voltage; and
   (f) a voltage source connected to the gate of the second bias transistor.

5. A rail-to-rail class AB output stage including:
   (a) a P-channel pull-up transistor having a source coupled to a first supply rail voltage, a gate coupled to a first input conductor of the output stage, and a drain coupled to an output terminal of the output stage;
   (b) an N-channel pull-down transistor having a source coupled to a second supply rail voltage, a gate coupled to a second input conductor of the output stage, and a drain coupled to the output terminal;
   (c) a P-channel first bias transistor having a source coupled to the first input conductor;
   (d) an N-channel second bias transistor having a source coupled to the second input terminal and a drain connected to a drain of the first bias transistor;
   (e) a amplifier having an output coupled to a gate of the first bias transistor, a first input coupled to the drain of the second bias transistor, and a second input coupled to a first reference voltage; and
   (f) a voltage source connected to the gate of the second bias transistor.

6. The rail-to-rail class AB output stage of claim 5 wherein the source of the P-channel first bias transistor is coupled to the first input conductor by means of an intermediate differential stage.

7. The rail-to-rail class AB output stage of claim 5 including a P-channel second bias transistor having a source coupled to the first input conductor, a drain coupled to the second input conductor, and a gate coupled to a second reference voltage.

8. The rail-to-rail class AB output stage of claim 5 wherein the source and drain of the N-channel second bias transistor are formed in a P-type substrate using a single-well CMOS manufacturing process.

9. The rail-to-rail class AB output stage of claim 8 wherein the amplifier operates to control a drain current in the N-channel second bias transistor so as to prevent the magnitude of the drain-source voltage of the N-channel second bias transistor from exceeding a value at which impact ionization causes a drain-to-body leakage current in the N-channel second bias transistor to exceed a predetermined level.

10. A rail-to-rail class AB output stage including:
(a) a P-channel pull-up transistor having a source coupled to a first supply rail voltage, a gate coupled to a first input conductor of the output stage, and a drain coupled to an output terminal of the output stage;
(b) an N-channel pull-down transistor having a source coupled to a second supply rail voltage, a gate coupled to a second input conductor of the output stage, and a drain coupled to the output terminal;
(c) a P-channel first bias transistor having a source coupled to the first input conductor, a drain coupled to the second input conductor, and a gate coupled to a first reference voltage;
(d) a first bias circuit coupled between the first and second supply rail voltages and producing a first bias voltage on a gate of the first bias transistor;
(e) a P-channel second bias transistor having a source coupled to be first input conductor;
(f) an N-channel third bias transistor having a source coupled to the second input terminal and a drain connected to a drain of the second bias transistor;
(g) a amplifier having an output coupled to a gate of the second bias transistor, a non-inverting input coupled to the drain of the third bias transistor, and an inverting input coupled to a second reference voltage; and
(h) a second bias circuit coupled between the first and second supply rail voltages and producing a third bias voltage on the gate of the third bias transistor.

11. The rail-to-rail class AB output stage of claim 10 wherein the amplifier includes a P-channel first transistor having a drain coupled to the gate of the second bias transistor and to a constant current source, a source coupled to the drain of the N-channel third bias transistor and a second constant current source, and a gate coupled to the second reference voltage, the gate of the first transistor being the inverting input of the amplifier, the source of the first transistor being the non-inverting input of the amplifier.

12. The rail-to-rail class AB output stage of claim 10 wherein the amplifier includes a first N-channel input transistor having a gate coupled to the drain of the third bias transistor, a source coupled to a constant current source, and a drain coupled to a load circuit, and a second N-channel input transistor having a gate coupled to a voltage source, a source coupled to the constant current source, and a drain coupled to the load circuit and to a gate of the second bias transistor.

13. The rail-to-rail class AB output stage of claim 10 wherein the source and drain of the N-channel third bias transistor are formed in a P-type substrate using a single-well CMOS manufacturing process.

14. The rail-to-rail class AB output stage of claim 13 wherein the amplifier operates to control a drain current in the N-channel third bias transistor so as to prevent the magnitude of the drain-source voltage of the N-channel third bias transistor from exceeding a value at which impact ionization causes a drain-to-body leakage current in the N-channel second bias transistor to exceed a predetermined level.

15. A CMOS rail-to-rail operational amplifier, comprising:
(a) a differential input stage receiving a differential input signal;
(b) a folded cascode stage receiving first and second output signals from the differential input stage;
(c) a rail-to-rail class AB output stage including
  i. a P-channel pull-up transistor having a source coupled to a first supply rail voltage, a gate coupled to a first input conductor of the output stage, and a drain coupled to an output terminal of the output stage, the first input conductor conducting a first current produced by the folded cascode stage,
  ii. an N-channel pull-down transistor having a source coupled to a second supply rail voltage, a gate coupled to a second input conductor of the output stage, and a drain coupled to the output terminal, the second input conductor conducting a second current produced by the folded cascode stage,
  iii. a P-channel first bias transistor having a source coupled to the first input conductor,
  iv. an N-channel second bias transistor having a source coupled to the second input terminal and a drain coupled to a drain of the first bias transistor,
  v. a P-channel third bias transistor having a source coupled to the input conductor and a drain coupled to the second input conductor,
  vi. an amplifier having an output coupled to a gate of the first bias transistor, a non-inverting input coupled to the drain of the second bias transistor, and an inverting input coupled to a first voltage source, and
  vii a second voltage source coupled to the gate of the second bias transistor.

16. The CMOS rail-to-rail operational amplifier of claim 15 wherein the folded cascode stage includes an upper cascode circuit including a P-channel first transistor having a source coupled to receive the first output signal from the differential input stage, a drain coupled to the first input conductor of the output stage, and a gate coupled to a first reference voltage, and wherein the folded cascode stage also includes a lower cascode circuit including an N-channel second transistor having a source coupled to receive the second output signal from the differential input stage, a drain coupled to the second input conductor of the output stage, and a gate coupled to a second reference voltage.

17. The rail-to-rail operational amplifier of claim 16 wherein the source and drain of the N-channel second bias transistor are formed in a P-type substrate using a single-well CMOS manufacturing process.

18. The rail-to-rail operational amplifier of claim 17 wherein the amplifier operates to control a drain current in the N-channel second bias transistor so as to prevent the magnitude of the drain-source voltage of the N-channel second bias transistor from exceeding a value at which impact ionization causes a drain-to-body leakage current in the N-channel second bias transistor to exceed a predetermined level.

* * * * *